US010892283B2

(12) United States Patent
Zhang et al.

(10) Patent No.: US 10,892,283 B2
(45) Date of Patent: Jan. 12, 2021

(54) FLEXIBLE DISPLAY PANEL

(71) Applicant: Wuhan China Star Optoelectronics Technology Co., Ltd., Wuhan (CN)

(72) Inventors: Jingli Zhang, Wuhan (CN); Zuomin Liao, Wuhan (CN); Jingfeng Xue, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 16/484,468

(22) PCT Filed: Apr. 25, 2019

(86) PCT No.: PCT/CN2019/084331
§ 371 (c)(1),
(2) Date: Aug. 8, 2019

(87) PCT Pub. No.: WO2020/107793
PCT Pub. Date: Jun. 4, 2020

(65) Prior Publication Data
US 2020/0251500 A1  Aug. 6, 2020

(30) Foreign Application Priority Data

Nov. 29, 2018 (CN) .......................... 2018 1 1446859

(51) Int. Cl.
*H01L 27/32* (2006.01)
*H01L 27/12* (2006.01)
*H01L 23/498* (2006.01)

(52) U.S. Cl.
CPC ........ *H01L 27/124* (2013.01); *H01L 23/4985* (2013.01); *H01L 27/1218* (2013.01)

(58) Field of Classification Search
CPC .............. G09F 9/30; G09G 3/20; H01L 27/32
See application file for complete search history.

(56) References Cited

U.S. PATENT DOCUMENTS

2019/0051718 A1* 2/2019 Zhang ................. H01L 27/3276

FOREIGN PATENT DOCUMENTS

| CN | 107219677 | 9/2017 |
|----|-----------|--------|
| CN | 107424551 | 12/2017 |
| CN | 107863006 | 3/2018 |
| CN | 108376519 | 8/2018 |
| CN | 108469697 | 8/2018 |
| CN | 108493227 | 9/2018 |

(Continued)

*Primary Examiner* — Thomas L Dickey

(57) ABSTRACT

A flexible display panel is provided and defined with a special-shaped cutout area and a display area, including a substrate, and a plurality of pixel structures, a scan line layer, and a data line layer disposed above the substrate, wherein each of the plurality of the pixel structures includes three sub-pixels, and the scan line layer includes a plurality of scan lines, and the data line layer includes a plurality of data lines. The sub-pixels are arranged as an array over the substrate, and the scan lines and the data lines are disposed in the array of the sub-pixels. A scan line is disposed between every two rows of the sub-pixels and two data lines are disposed between every column of the sub-pixels in the special-shaped cutout area. Therefore, the frame of the special-shaped cutout area can be reduced to realize the narrow frame of the special-shaped cutout area.

9 Claims, 2 Drawing Sheets

(56) References Cited

FOREIGN PATENT DOCUMENTS

| | | |
|---|---|---|
| CN | 108598139 | 9/2018 |
| CN | 108646486 | 10/2018 |
| CN | 108831302 | 11/2018 |

* cited by examiner

FLEXIBLE DISPLAY PANEL

RELATED APPLICATIONS

This application is a National Phase of PCT Patent Application No. PCT/CN2019/084331 having International filing date of Apr. 25, 2019, which claims the benefit of priority of Chinese Patent Application No. 201811446859.X filed on Nov. 29, 2018. The contents of the above applications are all incorporated by reference as if fully set forth herein in their entirety.

FIELD AND BACKGROUND OF THE INVENTION

The present application relates to display panel technologies, and more particularly to a flexible display panel.

Presently, full-screen display has become trendy on the market, especially with the release of XIAOMI MIX2 and IPHONE X. Because the full-screen display is of wide concern by the market, various mobile phone manufacturers have launched their mobile phones having a full-screen display. For the purpose to place electronic components such as front cameras and sensors on the body, the screen will have a certain distance from the phone edge. Therefore, in order to place electronic components such as a front camera, a sensor, and a receiver, the screen is needed to be U-cut.

There are two types of mobile phones having the full-screen displays on the market, one is the 18:9 screen display represented by XIAOMI MIX2, which compresses the non-display area of the mobile phone to increase the screen-to-body ratio. The other one is the "bang" design represented by IPHONE X. The design of IPHONE X has gradually become a full-screen display mainstream design, and the "bang" design is also called a notch screen, which is a special-shaped screen.

At the same time, because n-type metal-oxide semiconductors (NMOS) is cheaper than complementary metal-oxide semiconductors (CMOS), many products now use the NMOS design. The gate driver on array (GOA) circuit device of NMOS products is too large, and most products are driven on both sides, and the scan lines are deployed in the notch area. As shown in FIG. 1, a flexible display panel is defined with a special-shaped cutout area 4 and a display area 5. The flexible display panel further comprises a plurality of pixel structures 1, a plurality of scan lines 2 and a plurality of data lines 3, and the pixel structure 1 comprises a plurality of sub-pixels 11. In the cutout area 4, the scanning lines 2 are deployed, which results in the boundary area of the special-shaped cutout become too large, so that the narrow frame cannot be realized. The deeper the special-shaped cutout area 4, the more the scanning lines are needed, and it is more difficult to realize the narrow frame.

Therefore, there is a need for a novel flexible display panel to overcome the drawbacks of the related art.

SUMMARY OF THE INVENTION

The present application provides a flexible display panel to overcome the too large frame problem caused by too many scan lines deployed in the special-shaped cutout area of the related art.

The present application provides a flexible display panel to overcome the too large frame problem caused by too many scan lines deployed in the special-shaped cutout area of the related art.

To realize to previous objects, the present disclosure provides a flexible display panel, defined with a special-shaped cutout area and a display area, comprising a substrate, and a plurality of pixel structures, a scan line layer, and a data line layer disposed above the substrate, wherein each of the plurality of the pixel structures comprises three sub-pixels, and the scan line layer comprises a plurality of scan lines, and the data line layer comprises a plurality of data lines. The sub-pixels are arranged as an array over the substrate, and the scan lines and the data lines are disposed in the array of the sub-pixels. A scan line is disposed between every two rows of the sub-pixels and two data lines are disposed between every column of the sub-pixels in the special-shaped cutout area, and the sub-pixels are connected to the scan lines adjacent thereto, the sub-pixels in the odd rows are connected to the data lines on the left side thereof, and the sub-pixels in the even rows are connected to the data lines on the right side thereof.

In such configuration, the number of the scan lines in the special-shaped cutout area can be reduced, so that the frame of the special-shaped cutout area can be reduced.

Furthermore, in other embodiments, a distance between two rows of sub-pixels disposed with the scan line is defined as a first distance, and a distance between two columns of sub-pixels disposed with no scan line is defined as a second distance, and a length of the second distance is less than a length of the first distance.

Furthermore, in other embodiments, the length of the second distance is 50% to 80% of the length of the first distance. Preferably, the length of the second distance is 50% of the length of the first distance, and the length of the second distance can be determined according to the practical use, but not limited thereto. It is noted that the length of the second distance is less than the length of the first distance.

Furthermore, in other embodiments, the scan lines comprise the same metal material, and the metal material of the scan lines comprises molybdenum.

Furthermore, in other embodiments, the scan line layer comprises a first scan line layer and a second scan line layer, and the scan lines in the first scan line layer and the scan lines in the second scan line layer comprise different metal materials. In other embodiments, the metal material of the scan lines in the first scan line layer comprise molybdenum, and the metal material of the scan lines in the second scan line layer comprises aluminum. In such configuration, the number of the scan lines in the special-shaped cutout area can be reduced, so that the frame of the special-shaped cutout area can be reduced.

Furthermore, in other embodiments, a scan line is disposed between every two rows of the sub-pixels and two data lines are disposed between every column of the sub-pixels in the display area.

Furthermore, in other embodiments, the display area comprises a normal area and a modified area; a scan line is disposed between every two rows of the two sub-pixels and two data lines are disposed between every column of the sub-pixels in the modified area, and a scan line is disposed between every row of the sub-pixels and a data line is disposed between every column of the sub-pixels in the normal area.

Furthermore, in other embodiments, a surface area of the modified area is smaller than a surface area of the display area.

Furthermore, in other embodiments, a surface area of the modified area is 10% to 90% of a surface area of the display area.

Compared with the related art, the present disclosure provides a flexible display panel. Through formation of a scan line disposed between every two rows of the two sub-pixels and two data lines disposed between every column of the sub-pixels, the number of the scan lines in the special-shaped cutout area can be reduced to realize the narrow frame of the special-shaped cutout area.

BRIEF DESCRIPTION OF THE SEVERAL VIEW OF THE DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DESCRIPTION OF SPECIFIC EMBODIMENTS OF THE INVENTION

Figure 1:
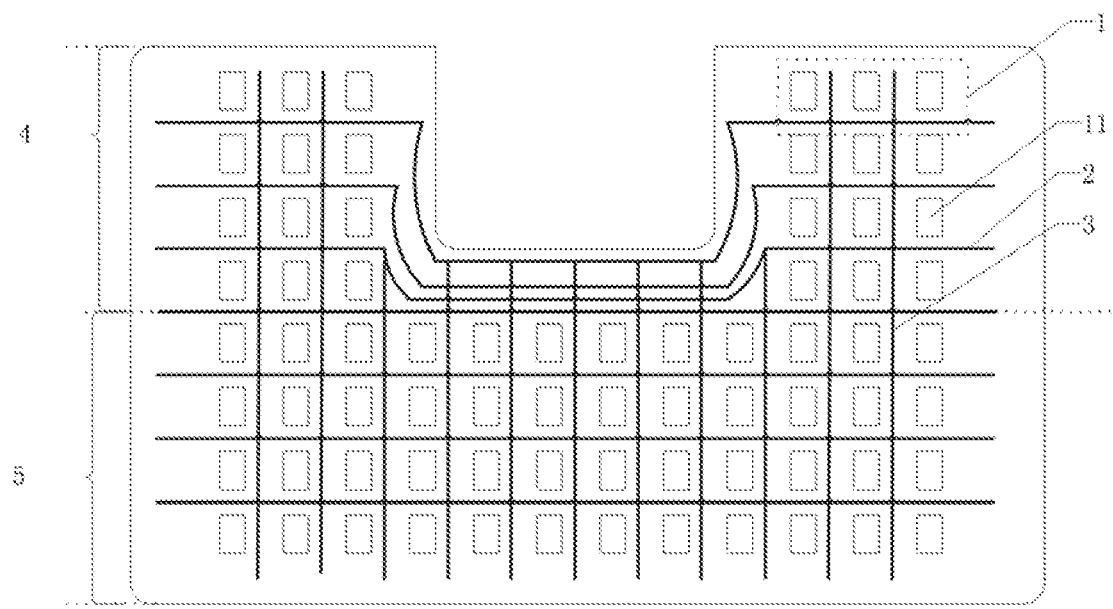
FIG. 1 is a schematic top view of a flexible display panel in the related art.

The technical solutions in the embodiments of the present disclosure are clearly and completely described in the following with reference to the accompanying drawings in the embodiments of the present disclosure. It is obvious that the described embodiments are only a part of the embodiments of the present disclosure, but are not all embodiments. All other embodiments obtained by those skilled in the art without creative efforts are within the scope of the present disclosure.

The specific structural and functional details disclosed are merely representative and are for the purpose of describing exemplary embodiments of the present disclosure. The present disclosure may, however, be embodied in many alternative forms and should not be construed as being limited only to the embodiments set forth herein.

In the description of the present disclosure, it is to be understood that the terms "center", "lateral", "upper", "lower", "left", "right", "vertical", "horizontal", "top", "bottom", "inside", "outside" and the like for describing orientation or positional relationship are based on the orientation or positional relationship shown in the drawings, and is merely for the convenience of describing the present disclosure and simplifying the description, and does not indicate or imply the indicated device. The components must have a particular orientation, are constructed and operated in a particular orientation, and thus are not to be construed as limiting the disclosure. Furthermore, the terms "first" and "second" are used for descriptive purposes only and are not to be construed as indicating or implying a relative importance or implicitly indicating the number of technical features indicated. Thus, features defined as "first" or "second" may include one or more of the features either explicitly or implicitly. In the description of the present disclosure, the meaning of "a plurality" is two or more unless otherwise specified. In addition, the term "comprises" and its variations are intended to cover a non-exclusive inclusion.

In the description of the present disclosure, it should be noted that the terms "installation", "connection", and "connected" are to be understood broadly, and may be fixed connection or detachable connection, for example, unless otherwise explicitly defined and defined. Connected, or integrally connected; can be mechanical or electrical; can be directly connected, or indirectly connected through an intermediate medium, can be the internal communication of the two components. The specific meaning of the above terms in the present disclosure can be understood in a specific case by those skilled in the art.

The terminology used herein is for the purpose of describing the particular embodiments, The singular forms "a", "an", It is also to be understood that the terms "comprising" and/or "comprising" are used to mean the presence of the described features, integers, steps, operations, units and/or components, and do not exclude the presence or addition of one or more Other features, integers, steps, operations, units, components, and/or combinations thereof.

Embodiment 1

Figure 2:
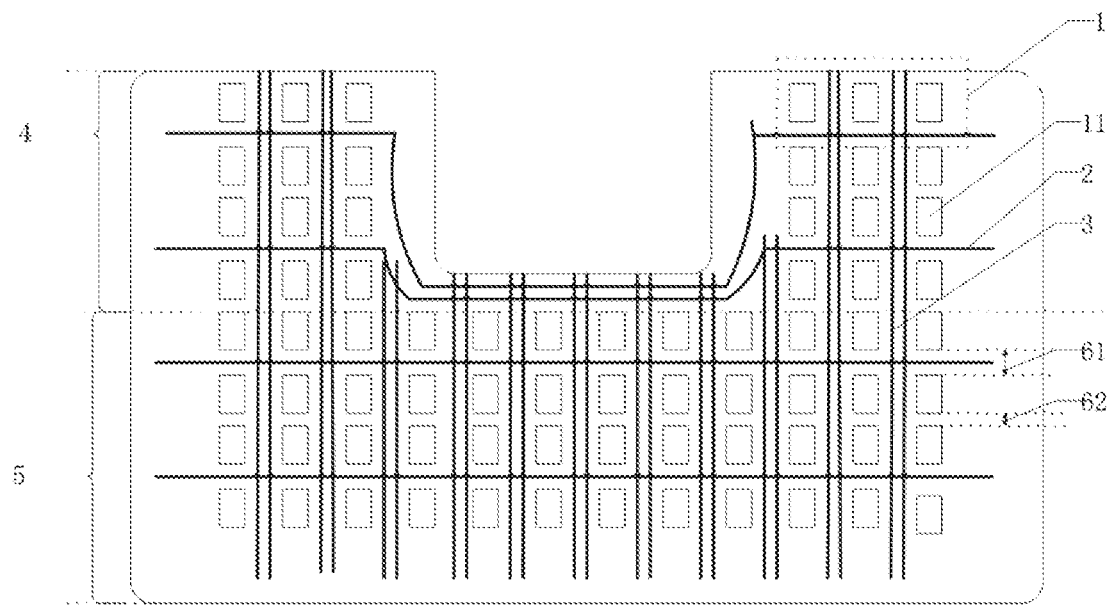
FIG. 2 is a schematic cross-sectional view of a flexible display panel according to the first embodiment of the present disclosure.

Referring to FIG. 2, the present disclosure provides a flexible display panel defined with a special-shaped cutout area 4 and a display area 5, comprising a substrate and a plurality of pixel structures 1, a scan line layer and a data line layer disposed on the substrate. The scan line layer comprises a plurality of scan lines 2, the data line layer comprises a plurality of data lines 3, and each of the pixel structures 1 comprises three sub-pixels 11.

The sub-pixels 11 are arranged in an array over the substrate, and the scan lines 2 and the data lines 3 are disposed in the sub-pixel array. A scan line 2 is disposed between every two rows of sub-pixels 11, and two data lines 3 are disposed between each column of sub-pixels 11.

A distance between the two rows of sub-pixels 11 disposed with the scan lines is the first distance 61, and a distance between the two rows of sub-pixels 11 not provided with the scan lines is the second distance 62. A length of the second distance 62 is less than a length of the first distance 61. This configuration may compensate the opening loss caused by the way of double data lines.

In other embodiments, the length of the second distance 62 is 50% to 80% of the length of the first distance 61. In the present embodiment, the length of the second distance is preferably 50% of the length of the first distance. In other embodiments, the length of the second distance can be determined according to the practical use, but not limited thereto. It is noted that the length of the second distance is less than the length of the first distance.

In this embodiment, the scan lines 2 comprise the same metal material, the data lines 3 comprise the same metal material, and the metal materials of the scan lines 2 and the data lines 3 comprise molybdenum.

In other embodiments, the scan line layer comprises a first scan line layer and a second scan line layer, and the scan line 2 in the first scan line layer and the scan line 2 in the second scan line layer comprise different metal materials. In other embodiments, the metal material used for the scan lines in the first scan line layer comprises metal molybdenum, and the metal material used for the scan lines in the second scan line layer comprises aluminum. In such configuration, the number of the scan lines in the special-shaped cutout area can be reduced, so that the frame of the special-shaped cutout area can be reduced.

In other embodiments, the data line layer comprises a first data line layer and a second data line layer. The data line 3 in the first data line layer and the data line 3 in the second data line layer comprise different metal materials. In other embodiments, the metal material used in the data line in the first data line layer comprises molybdenum, and the metal material in the data line in the second scan line layer comprises aluminum. In such configuration, the number of the scan lines in the special-shaped cutout area can be reduced, so that the frame of the special-shaped cutout area can be reduced.

Figure 3:
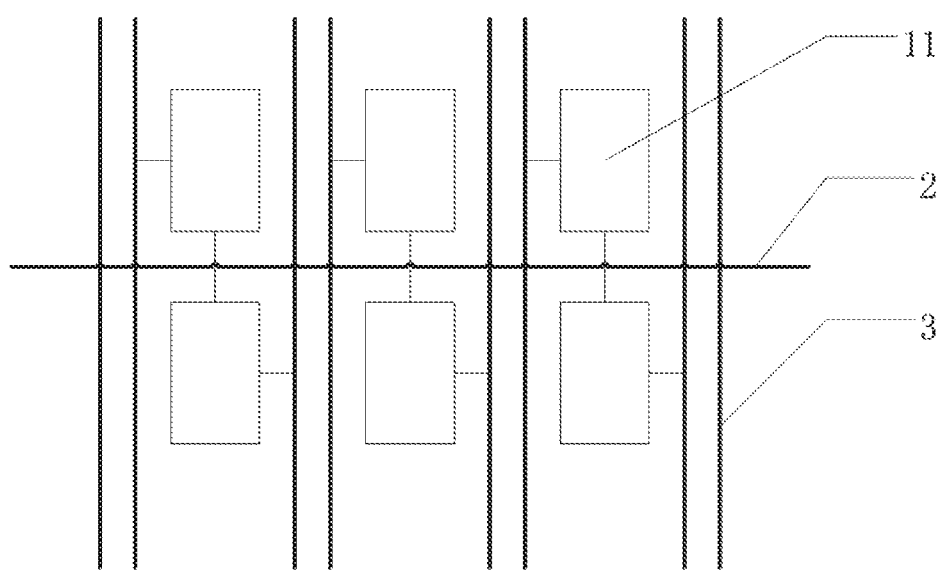
FIG. 3 is a partially enlargement of pixel structures in the flexible display panel according to the first embodiment of the present disclosure.

As shown in FIG. 3, FIG. 3 is a partially enlargement of pixel structures in the flexible display panel according to the embodiment of the present disclosure. The pixel structure 1 comprises a plurality of sub-pixels 11 connected to adjacent scan lines 2 and odd rows. The sub-pixel 11 is connected to the data line 3 on the left side thereof, and the sub-pixel 11 on the even line is connected to the data line 3 on the right side thereof.

Embodiment 2

The flexible display panel structure in embodiment 2 is also defined with a special-shaped cutout area and a display area, which are substantially the same as the structures in embodiment 1. The same structure can be referred to the corresponding description in the embodiment 1, and are not described again. The main difference between these two embodiments is that a scan line is disposed between each row of sub-pixels and a data line is disposed between each column of sub-pixels in the display area in this embodiment.

Example 3

The flexible display panel structure in embodiment 2 is also defined with a special-shaped cutout area and a display area, which are substantially the same as the structures in embodiment 1. The same structure can be referred to the corresponding description in the embodiment 1, and are not described again. The main difference between these two embodiments the display area in this embodiment comprises a normal area and a modified area. A scan line is disposed between every two rows of the two sub-pixels and two data lines are disposed between every column of the sub-pixels in the modified area, and a scan line is disposed between every row of the sub-pixels and a data line is disposed between every column of the sub-pixels in the normal area.

Furthermore, in other embodiments, a surface area of the modified area is smaller than a surface area of the display area.

Furthermore, in other embodiments, a surface area of the modified area is 10% to 90% of a surface area of the display area. Preferably, the surface area of the modified area is 50% of the surface area of the display area, and the surface area of the display area can be determined according to the practical use, but not limited thereto. It is noted that the surface area of the modified area is less than the surface area of the display area.

Compared with the related art, the present disclosure provides a flexible display panel. Through formation of a scan line disposed between every two rows of the two sub-pixels and two data lines disposed between every column of the sub-pixels, the number of the scan lines in the special-shaped cutout area can be reduced to realize the narrow frame of the special-shaped cutout area.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A flexible display panel, defined with a special-shaped cutout area and a display area, comprising a substrate, and a plurality of pixel structures, a scan line layer, and a data line layer disposed above the substrate, wherein:
   each of the plurality of the pixel structures comprises three sub-pixels, and the scan line layer comprises a plurality of scan lines, and the data line layer comprises a plurality of data lines;
   the sub-pixels are arranged in an array over the substrate, and the scan lines and the data lines are disposed in the array of the sub-pixels;
   a scan line is disposed between every two rows of the sub-pixels and two data lines are disposed between every column of the sub-pixels in the special-shaped cutout area, and the sub-pixels are connected to the scan lines adjacent thereto, the sub-pixels in the odd rows are connected to the data lines on the left side thereof, and the sub-pixels in the even rows are connected to the data lines on the right side thereof;
   wherein a distance between two rows of sub-pixels disposed with the scan line is defined as a first distance; and
   wherein a distance between two columns of sub-pixels disposed with no scan line is defined as a second distance, and a length of the second distance is less than a length of the first distance.

2. The flexible display panel as claimed in claim 1, wherein the length of the second distance is 50% to 80% of the length of the first distance.

3. The flexible display panel as claimed in claim 1, wherein the scan lines comprise the same metal material, and the metal material of the scan lines comprises molybdenum.

4. The flexible display panel as claimed in claim 1, wherein:
   the scan line layer comprises a first scan line layer and a second scan line layer, and the scan lines in the first scan line layer and the scan lines in the second scan line layer comprise different metal materials;
   the metal material of the scan lines in the first scan line layer comprise molybdenum; and
   the metal material of the scan lines in the second scan line layer comprises aluminum.

5. The flexible display panel as claimed in claim 1, wherein the sub-pixels comprise switching elements and the switching elements are connected to the scan lines and the data lines corresponding to the sub-pixels.

6. The flexible display panel as claimed in claim 1, wherein a scan line is disposed between every two rows of the sub-pixels and two data lines are disposed between every column of the sub-pixels in the display area.

7. The flexible display panel as claimed in claim 1, wherein:
   the display area comprises a normal area and a modified area;
   a scan line is disposed between every two rows of the two sub-pixels and two data lines are disposed between every column of the sub-pixels in the modified area; and
   a scan line is disposed between every row of the sub-pixels and a data line is disposed between every column of the sub-pixels in the normal area.

8. The flexible display panel as claimed in claim 7, wherein a surface area of the modified area is smaller than a surface area of the display area.

9. The flexible display panel as claimed in claim 7, wherein a surface area of the modified area is 10% to 90% of a surface area of the display area.

* * * * *